United States Patent
Yoshiba et al.

(10) Patent No.: US 8,105,883 B2
(45) Date of Patent: Jan. 31, 2012

(54) MOLDING DIE WITH TILTED RUNNER, METHOD OF MANUFACTURING SEMICONDUCTOR DEVICE USING THE SAME, AND SEMICONDUCTOR DEVICE MADE BY THE METHOD

(75) Inventors: Shigeharu Yoshiba, Oizumi-machi (JP); Hirokazu Fukuda, Ota (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 164 days.

(21) Appl. No.: 12/568,486

(22) Filed: Sep. 28, 2009

(65) Prior Publication Data
US 2010/0219517 A1   Sep. 2, 2010

(30) Foreign Application Priority Data

Feb. 27, 2009 (JP) ................ 2009-046355
Feb. 27, 2009 (JP) ................ 2009-046356

(51) Int. Cl.
*H01L 21/56* (2006.01)
(52) U.S. Cl. ... 438/127; 438/126; 438/124; 264/272.17; 257/E21.504; 257/E21.503; 257/E23.044; 257/787; 257/676
(58) Field of Classification Search ............ 438/127; 257/686
See application file for complete search history.

(56) References Cited

U.S. PATENT DOCUMENTS
4,946,633 A * 8/1990 Saeki et al. .......... 264/40.1

FOREIGN PATENT DOCUMENTS
JP   1-205432       8/1989
JP   2004-158539    6/2004
JP   2004158539 A * 6/2004

OTHER PUBLICATIONS
An English machine translation of JP2004-158539A.*
* cited by examiner

*Primary Examiner* — Matthew Landau
*Assistant Examiner* — Khaja Ahmad
(74) *Attorney, Agent, or Firm* — Morrison & Foerster LLP (57) ABSTRACT

Provided is a method for manufacturing a semiconductor device in which movement of an island in resin sealing is prevented. A molding die includes an upper die and a lower die. The upper and lower dies are fitted together to form cavities and runners. In the lower die, a pod is provided. After heating and melting of a tablet made of a solid resin and housed in the pod, the melted sealing resin is pressurized by a plunger, and is supplied to each of the cavities. Specifically, a liquid sealing resin is supplied from the pod to the cavities, sequentially, from the upstream of the flow of the sealing resin supplied from the pod. The cavities communicate with each other through the runners. Furthermore, the runners through which the cavities communicate are provided to be tilted with respect to a path for supplying the sealing resin.

16 Claims, 13 Drawing Sheets

Prior Art

FIG.7B

Prior Art

FIG.7C

Prior Art

MOLDING DIE WITH TILTED RUNNER, METHOD OF MANUFACTURING SEMICONDUCTOR DEVICE USING THE SAME, AND SEMICONDUCTOR DEVICE MADE BY THE METHOD

This application claims priority from Japanese Patent Application Number JP2009-46355 filed on Feb. 27, 2009, and Japanese Patent Application Number JP2009-46356 filed on Feb. 27, 2009, the contents of which are incorporated herein by reference in their entirety.

BACKGROUND OF THE INVENTION

1. Field of the Invention

The present invention relates to a method for manufacturing a semiconductor device, a semiconductor device and a molding die.

2. Description of the Related Art

A process for manufacturing a semiconductor device is classified broadly into a pre-process for mounting desired elements on a semiconductor wafer and a post-process for packaging semiconductor elements obtained by dividing the semiconductor wafer. The post-process includes a step of sealing the semiconductor elements with a resin.

Figure 7A:
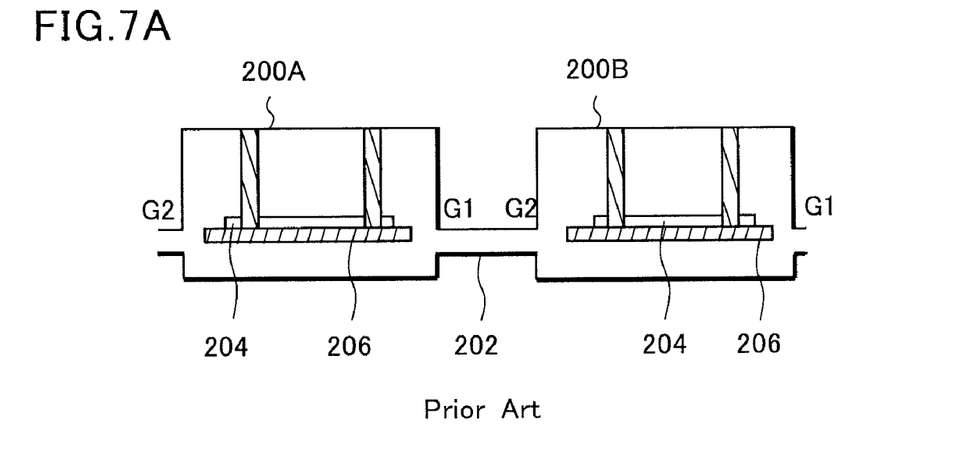
FIGS. 7A to 7C are views showing a resin sealing step in a method for manufacturing a semiconductor device according to the background art.
Figure 7B:
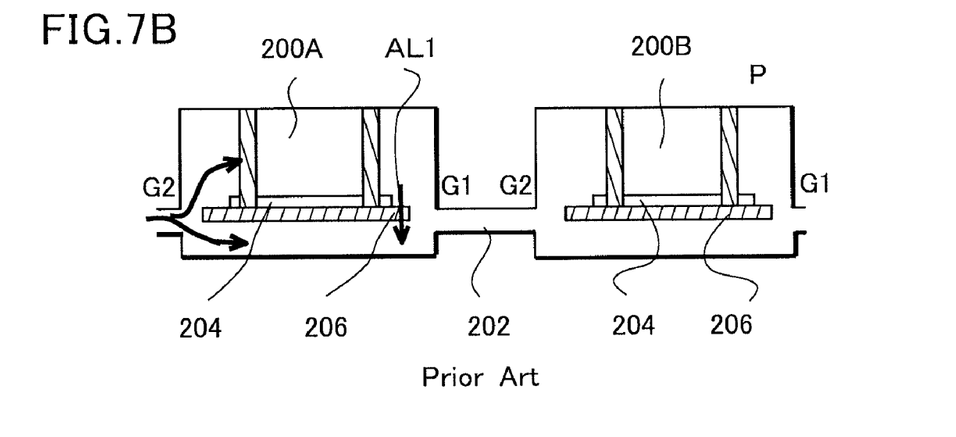
Figure 7C:
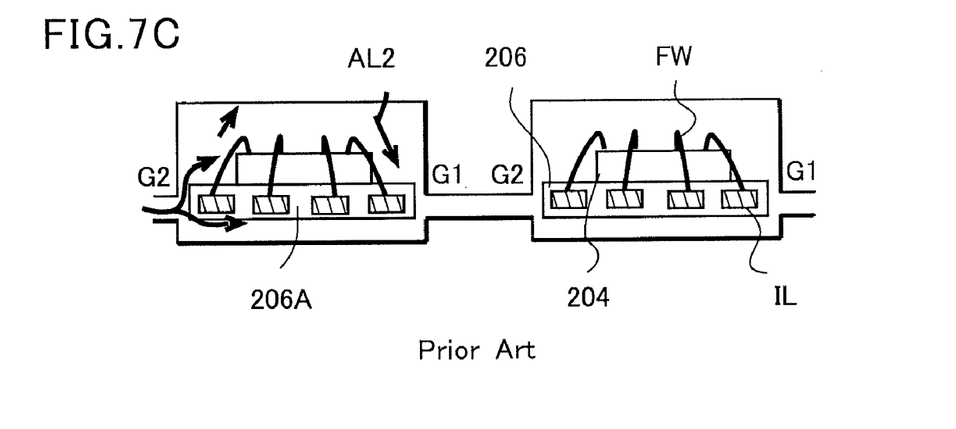

This sealing step will be described with reference to FIGS. 7A to 7C. In the sealing step, disruption of a balance of resin pressure due to providing a resin on a back surface of an island 206 as shown in FIGS. 7A to 7C may cause various problems. This will be described below.

Figure 5A:
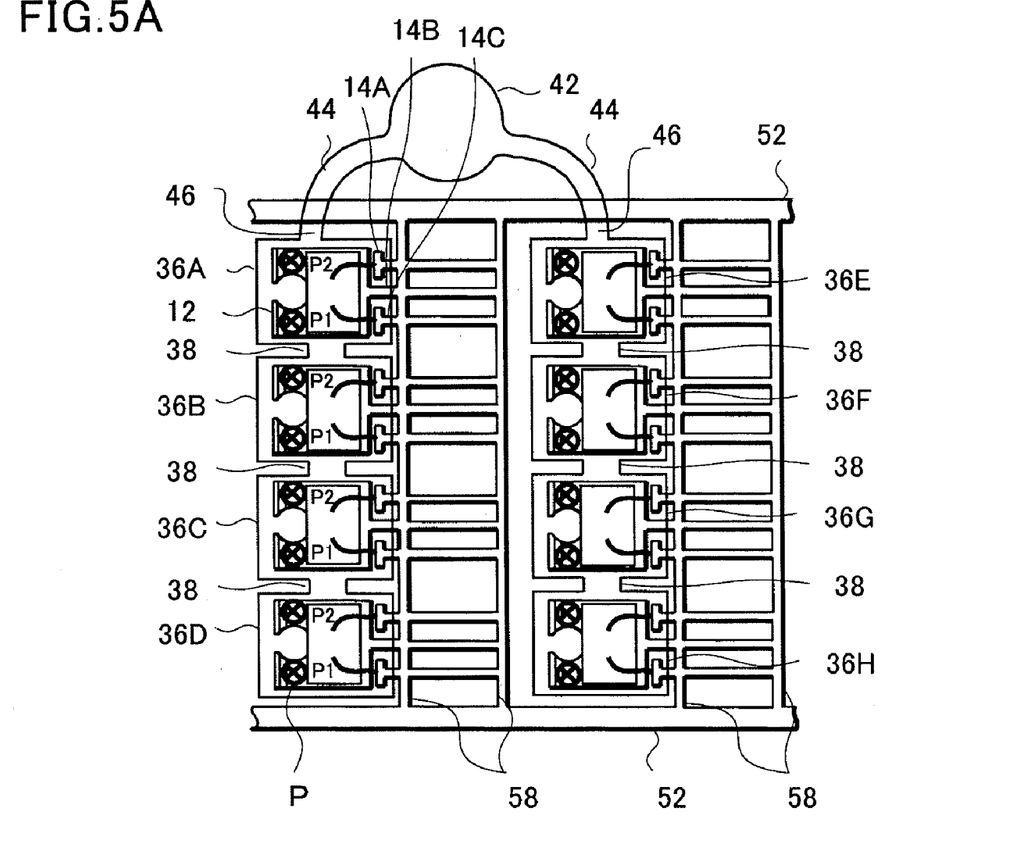
FIG. 5A is a plan view and FIG. 5B is an enlarged plan view showing the method for manufacturing a semiconductor device according to the present invention.
Figure 5B:
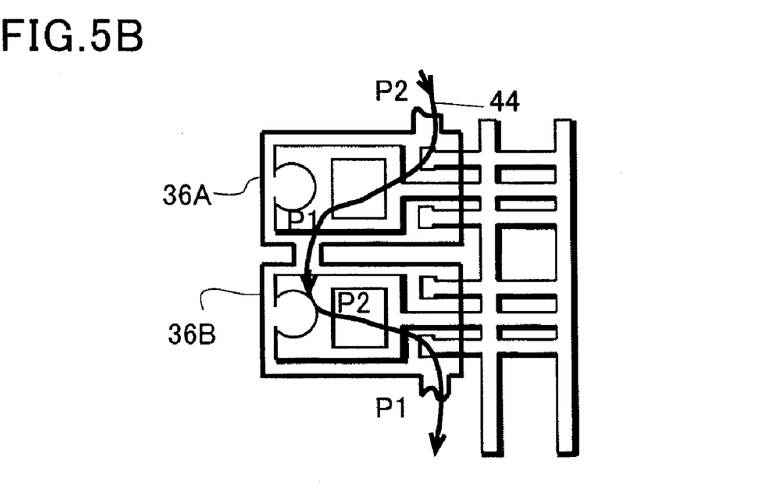

For example, in a through-gate method shown in FIGS. 5A and 5B, plural cavities are connected in series through runners 44 from a pod 42. This method can shorten distances between the cavities and thus can significantly reduce an amount of molding resin to be consumed. Therefore, the through-gate method is an excellent method which can also increase the number of elements per unit area of die and improve manufacturing efficiency. This method has been reported by Junichi Saeki et al. in Japanese Patent Application Publication No. Hei 1-205432, for example.

FIGS. 7A to 7C show two cavities in the method described above. With reference to FIG. 7A, plural cavities 200A and 200B are provided in a molding die and the cavities 200A and 200B communicate with each other through a runner 202. In each of the cavities 200A and 200B, an island 206 having a semiconductor element 204 mounted on its upper surface is housed.

With reference to FIG. 7B, next, a sealing resin is injected into each of the cavities 200A and 200B. Specifically, an unillustrated pod is connected on the left side of the cavity 200A, and a liquid resin supplied from the pod is first injected into the cavity 200A and then supplied to the cavity 200B through the runner 202. In FIG. 7B, a flow of the sealing resin is indicated by bold arrows. A part of a sealing resin 210 injected into the cavity 200A is injected below the island 206 and the rest thereof is injected above the island 206. Note that pressing pins P are provided for the island 206, because the island 206 is inevitably pushed up by the resin thinly applied on the back surface of the island 206. These pressing pins are provided in portions indicated by circled x shown in FIG. 5A in a TO220 package, for example.

Furthermore, the above resin sealing method using the molding die is described for instance in Japanese Patent Application Publication No. 2004-158539.

However, the above sealing resin injection method has a problem that the island 206 is moved by an injection pressure of the resin injected into the cavity 200A.

Specifically, when viewed in a cross-sectional view of FIG. 7B, the resin entering the cavity 200A from a gate G2 is roughly divided into a resin entering a space between the back surface of the island 206 and the lower die and a resin injected into a space between a front surface of the island 206 and the upper die. Since the space between the back surface of the island 206 and the lower die has a smaller volume, the space is first fully filled with the resin and the resin applies an upward force to the island 206. However, the pins P suppress a rise of the island 206.

On the other hand, since the space between the front surface of the island 206 and the upper die has a larger volume, the resin is subsequently fully filled. However, the gates G2 and G1 are arranged on the same level in height as or below the arrangement position of the island 206 in order to fill the resin below the back surface of the island. The filled resin flows downward toward the outlet G1 and thus a downward force acts on the right end of the island 206 as indicated by a downward arrow AL1. Specifically, in FIG. 7B, the right side of the island 206 is lowered with a contact point of the left pin P as a fulcrum point.

Accordingly, the thickness of the sealing resin covering the back surface of the island 206 is reduced. Thus, there is a possibility that a predetermined breakdown voltage cannot be obtained. This also leads to deterioration in moisture resistance.

Moreover, FIG. 7C shows a general IC package. In this package, a resin is also filled below a back surface of an island 206A. In this case, the resin moves in the same manner as shown in FIG. 7B, and a thin metal wire FW near a gate G1 is pressed downward and deformed by a resin pressure or even comes into contact with a corner of the chip in a worse case. Moreover, an inner lead may be deformed.

The present invention is capable of providing a highly reliable product by adjusting attachment positions of runners in the through-gate method.

SUMMARY OF THE INVENTION

Figure 6A:
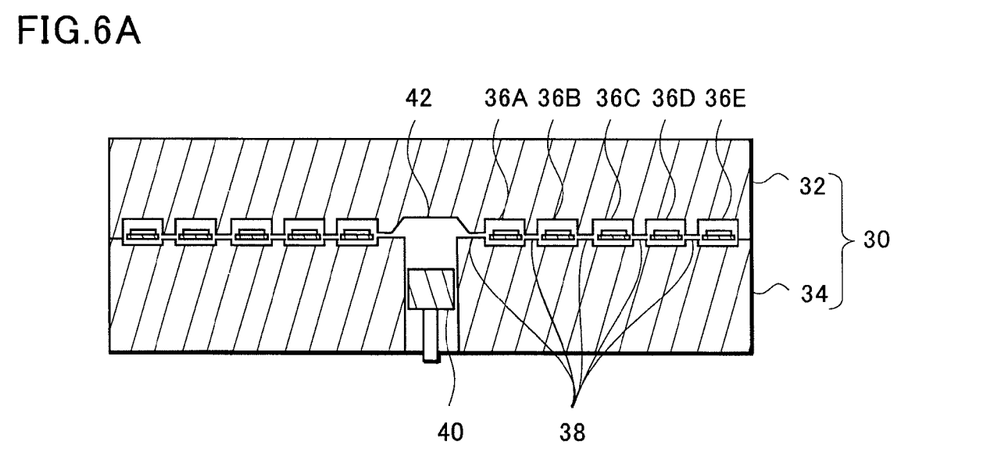
FIGS. 6A to C are views showing the method for manufacturing a semiconductor device according to the present invention.
Figure 6B:
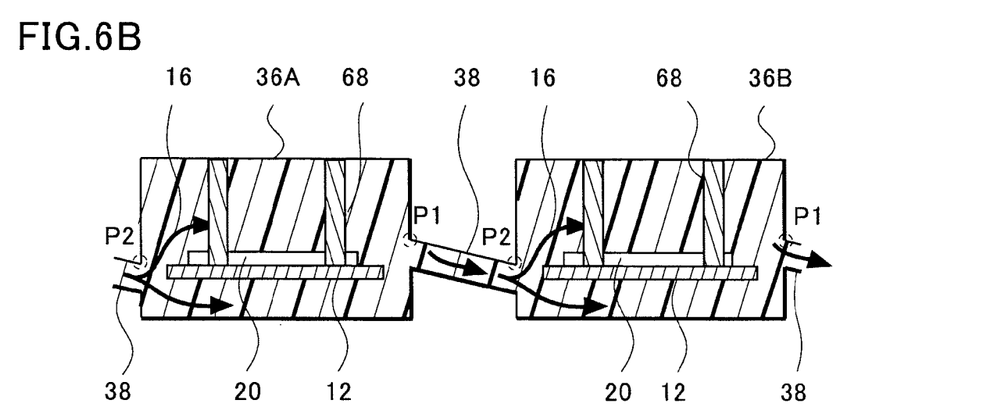

The present invention has been made to solve the foregoing problems in such a way that, in a cross-sectional view of FIG. 6B, a gate P2 for injecting a resin into a cavity 36A is arranged to be flush with or approximately flush with an island 12 whereas an outlet P1 for discharging the resin is arranged on a higher level than the gate P2.

Specifically, solving means of the invention of the present application is as follows.

A method for manufacturing a semiconductor device according to the present invention includes the steps of: preparing a molding die formed of a first die and a second die, the molding die having at least a plurality of cavities connected in series through runners from a pod; disposing a lead frame in the molding die in a state where a mounting part having at least an island and leads having one ends connected to the island is disposed in each of the cavities, where a semiconductor element is fixed on one side of the island and where the leads and the semiconductor element are electrically connected to each other through thin metal wires; and injecting a molten resin into at least the plurality of cavities through the runners from the pod and injecting the molten resin into each of the cavities including a space between the other side of the island and the first die, wherein a position of an outlet of the molten resin in the cavity is set closer to one side than a position of an inlet of the molten resin in the cavity is, thereby preventing displacement of the island near the outlet, the inner lead near the outlet or the thin metal wires near the outlet.

Furthermore, a method for manufacturing a semiconductor device according to the present invention includes the steps of: preparing a molding die formed of a first die and a second die, the molding die having at least a plurality of cavities connected in series through runners from a pod; disposing a lead frame in the molding die in a state where a mounting part is disposed in each of the cavities, the mounting part having a rectangular island with first and second sides facing each other and third and fourth sides facing each other, holding leads provided on the first and second sides close to an inlet and an outlet of the cavity, and a plurality of leads having one ends disposed on the third and fourth sides intersecting with the first side, where a semiconductor element is fixed on one side of the island, and where the leads and the semiconductor element are electrically connected to each other through thin metal wires; and injecting a molten resin into at least the plurality of cavities through the runners from the pod and injecting the molten resin into each of the cavities including a space between the other surface of the island and the first die, wherein a position of an outlet of the molten resin in the cavity is set closer to one side than a position of an inlet of the molten resin in the cavity is, thereby preventing displacement of the island near the outlet, the inner lead near the outlet or the thin metal wires near the outlet.

Figure 6C:
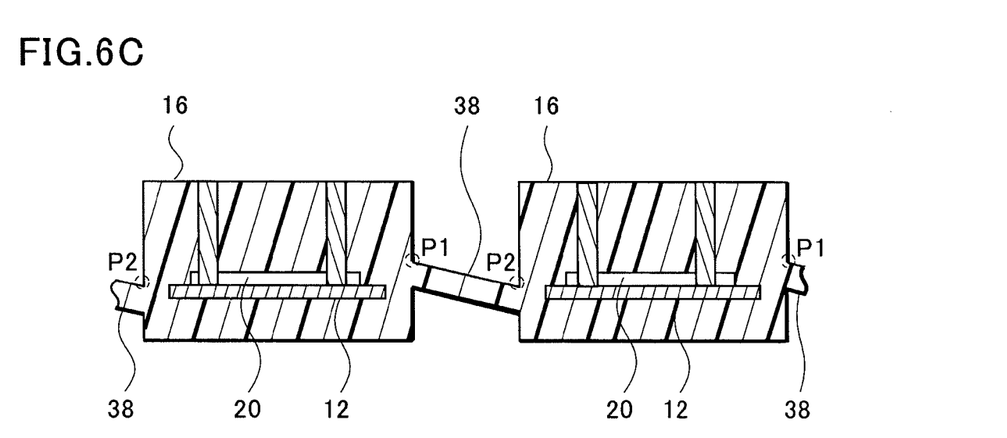

With reference to FIGS. 6A to 6C, the resin in the cavity 36A subsequently fills the space between the island 12 and the upper die. In this event, since there is more resin near the outlet P1, a downward force acts on the island 12. However, by setting the position of the outlet P1 above the island, more specifically, further above the position of the gate P2, an amount of the resin applying a pressure can be actively sent to the next cavity. Thus, the resin pressure is reduced for the amount of the resin sent. Consequently, the tilt of the island 12 can be reduced.

BRIEF DESCRIPTION OF THE DRAWINGS

FIGS. 13A1 to 13D are views showing a semiconductor device according to the present invention.

DESCRIPTION OF THE EMBODIMENTS

Figure 1A:
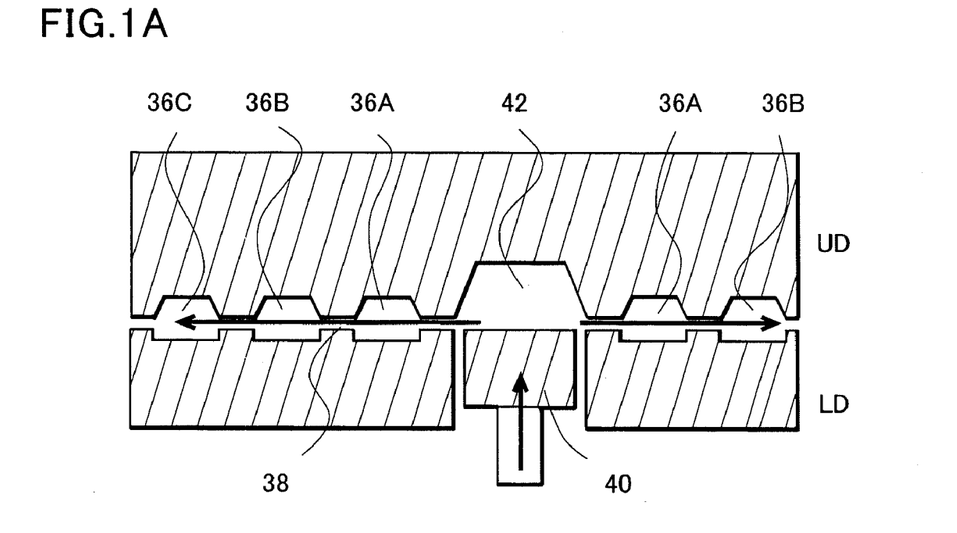
FIGS. 1A to 1D are views showing a method for manufacturing a semiconductor device according to the present invention.
Figure 1B:
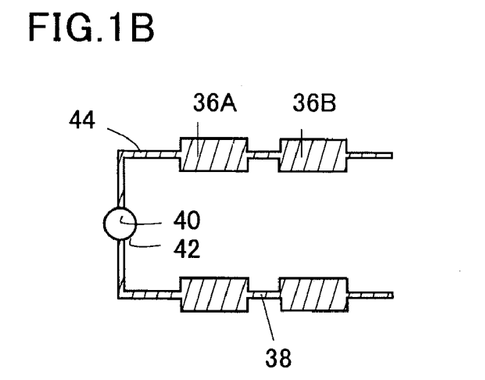
Figure 1C:
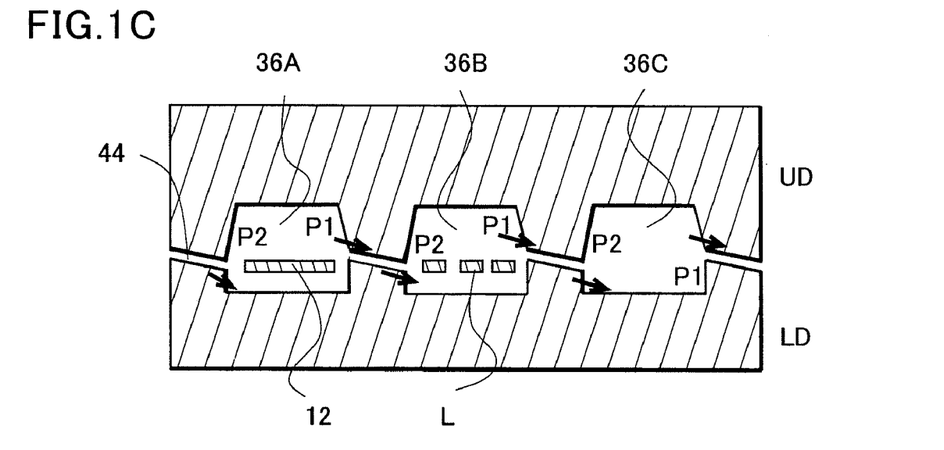
Figure 1D:
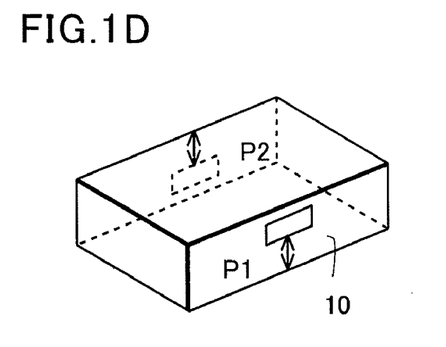

The present invention will be described below. First, with reference to FIG. 1, basic principles will be described. FIG. 1A is a schematic cross-sectional view showing a molding die. FIG. 1B is a plan view of the molding die. FIG. 1C is a view specifically showing a flow of a resin. FIG. 1D is a view showing a semiconductor device taken out of the die, particularly showing cutting traces of entry and exit gates.

The die includes an upper die UD and a lower die LD. The upper and lower dies are fitted together to form cavities 36A, 36B, . . . . The plural cavities are connected in series through runners from a pod 42. Moreover, a tablet (not shown) housed in the pod 42 is heated and pressurized by a plunger 40. Accordingly, a melted resin flows to a runner 44, the cavity 36A, a runner 38, the cavity 36B . . . from the pod 42.

FIG. 1B shows a flow of the resin from the pod 42 and a connection direction of the cavities. Here, two cavity arrays are connected in a horseshoe shape with the pod 42 at their center. However, there may be at least one cavity array and there may be plural cavities in one cavity array. Furthermore, planar arrangement may be in a radial fashion with the pod 42 at the center.

FIG. 1C shows the point of the present invention. Specifically, the runners (also called through-gates) between the cavities are horizontally arranged in the conventional case but obliquely arranged in the present invention. To be more specific, in a cross-sectional view of a first cavity 36A, a position (level in height) of a resin outlet P1 is set higher than a position (level in height) of a resin inlet P2. As to the runner between the cavities 36A and 36B, the left-side outlet P1 is provided higher than the right-side inlet P2. Thus, oblique arrangement is realized, in which the downstream of the flow of the resin is set lower than the upstream thereof.

As shown in FIG. 1D, an individually molded semiconductor device 10 is assumed to be a hexahedron having a top surface, a rear surface and four side surfaces. Moreover, gate traces P2 and P1 formed on the side surfaces facing each other are set at different positions from each other. Specifically, a level in height of an outlet P1 is set higher than a level in height of an inlet P2.

An island 12 is shown in the cavity 36A and a lead L is shown in the cavity 36B. Although the same component is normally sealed in the two cavities, different components are shown here for convenience of the drawing.

Figure 2A:
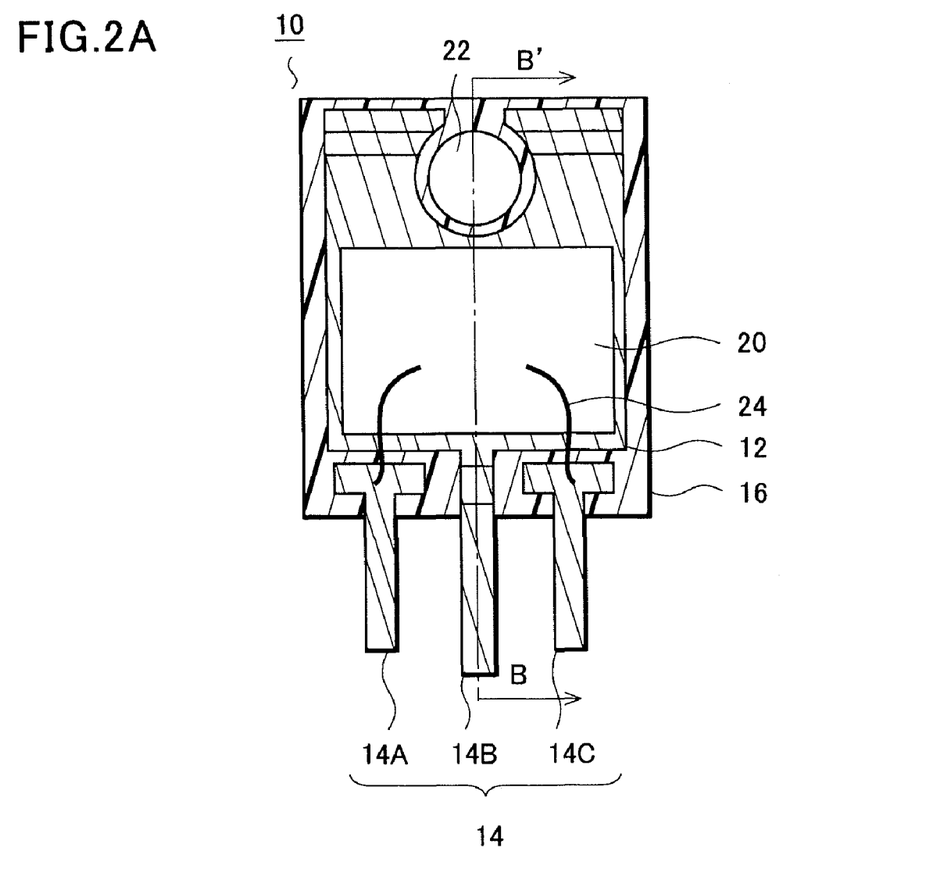
FIG. 2A is a plan view and FIG. 2B is a cross-sectional view showing a semiconductor device manufactured by the present invention.
Figure 2B:
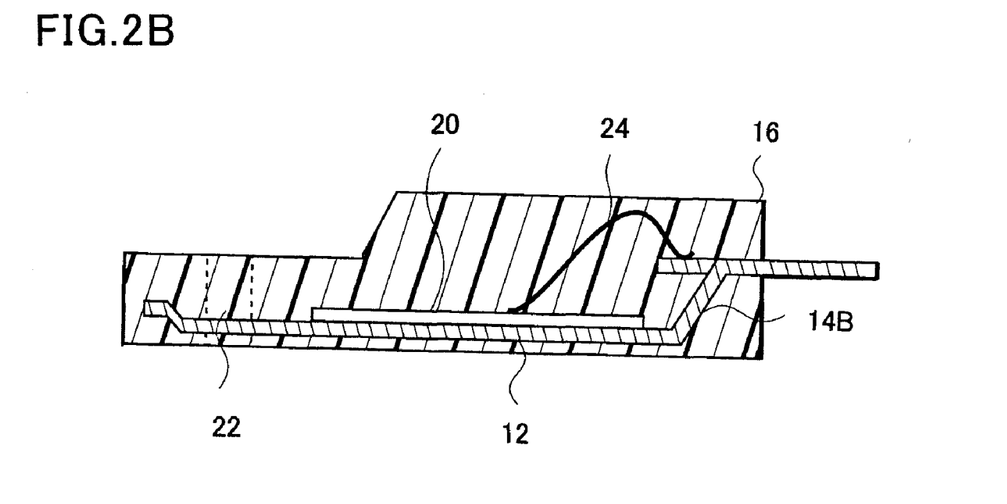
Figure 8A:
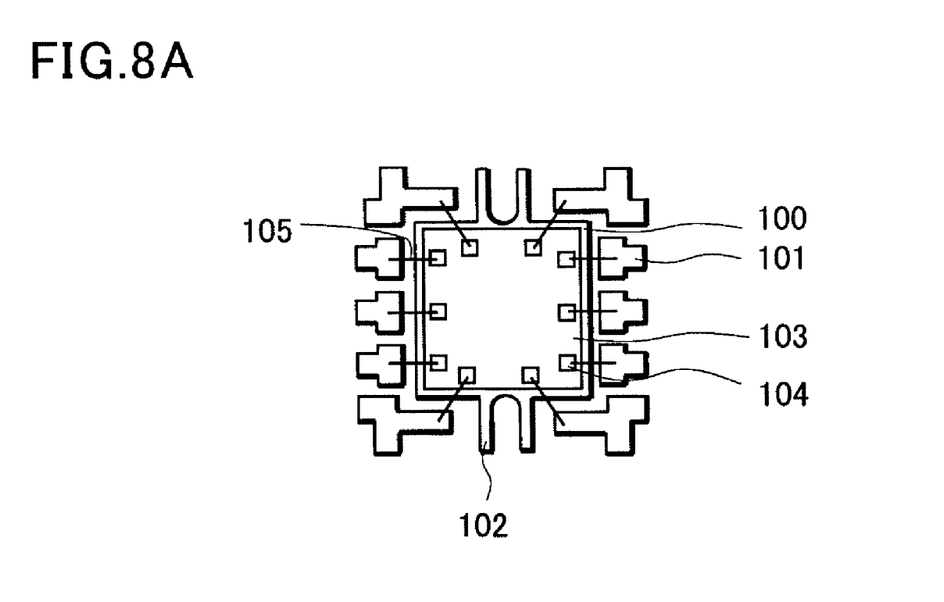
FIGS. 8A and 8B are views showing a semiconductor device according to the present invention.
Figure 8B:
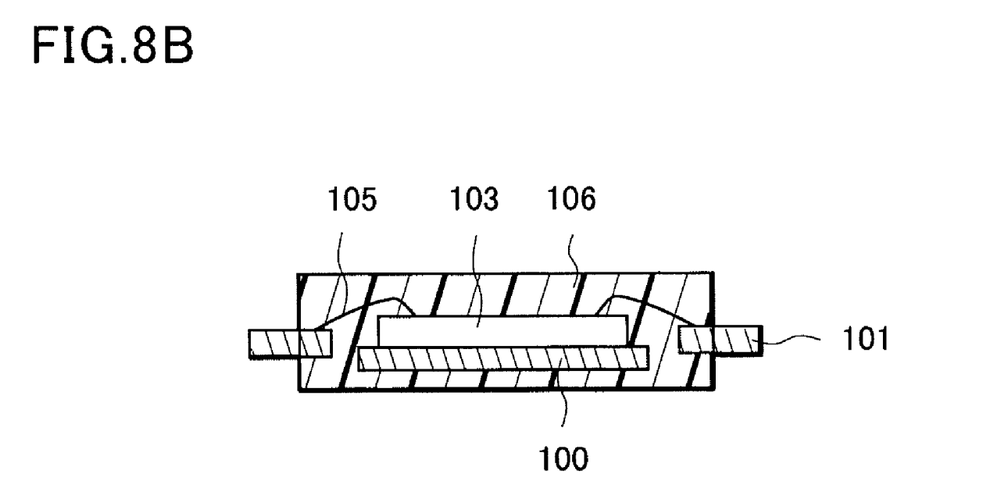

The above two types may be a discrete package such as TO220 shown in FIG. 2 and an IC package shown in FIG. 8.

The both types have islands, and each of the islands has its back surface sealed. Thus, in order to eliminate an unfilled portion in a narrow gap between the back surface of the island 12 and the lower die LD, the inlet P2 is placed on approximately the same level as the island 12 or within a range of ±100 μm from the level of the island 12. In addition, having a gap on the back side of the island 12 means that the island 12 is likely to move by a distance equivalent to a thickness of the gap.

Thus, the resin outlet P1 is set at a higher level than the inlet P2. Alternatively, by providing the P1 on a higher level than the island 12, the island 12 can be prevented from being moved by a resin pressure. Specifically, the resin can be moved before the resin applies a pressure onto the island. Thus, levelness of the island can be maintained. Moreover, all inner leads L can be set on approximately the same level. Furthermore, deformation of thin metal wires to be connected to the inner leads L can also be prevented.

Embodiment 1

With reference to FIG. 2, Embodiment 1 will be described. FIG. 2A is a plan view showing a semiconductor device 10 and FIG. 2B is a cross-sectional view taken along the line B-B' in FIG. 2A.

The semiconductor device 10 is a discrete transistor, in which a back surface of an island 12 is covered with a resin, and is, for example, a 3-terminal package or a package such as TO220. This semiconductor device 10 mainly includes: the island 12; a semiconductor element 20 mounted on an upper surface of the island 12; a lead 14 which functions as an external connection terminal; and a sealing resin 16 integrally covering and mechanically supporting those described above. A lead 14B is extended integrally with the island 12 and serves as an electrode at a current outflow side (or inflow side). One of leads 14A and 14C serves as a control electrode and the other serves as an electrode at a current inflow side (or outflow side). Specifically, the semiconductor element 20 is a BIP Tr, a MOS Tr, an IGBT, a GTBT or the like. The leads 14B, 14A and 14C are a collector, a base and an emitter, respectively, and serve as a source, a gate and a drain, respectively.

The package has a shape as shown in FIG. 13 and, broadly speaking, includes: an island 12; a lead 14B integrated with the island 12; leads 14A and 14C which are positioned on both sides of the lead 14B and formed separately from the island 12; a semiconductor element 20 provided on the island 12; thin metal wires 24 connecting the semiconductor element to the leads 14A and 14C; and a sealing resin covering at least a part of a back surface of the island 12 and covering a surface of the island, the semiconductor element and the thin metal wires.

Figure 13A:
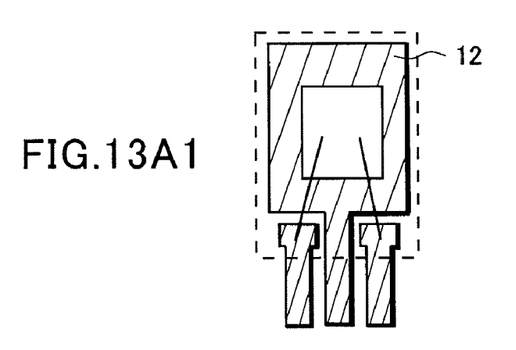
Figure 13A:
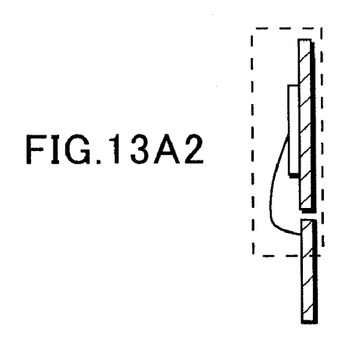
Figure 13B:
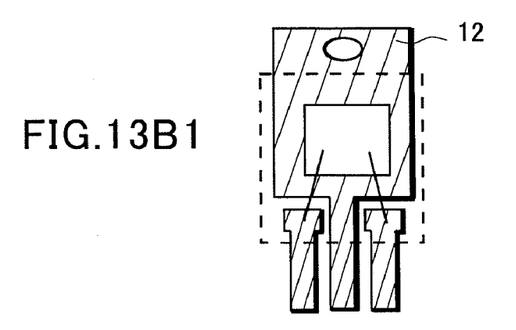
Figure 13B:
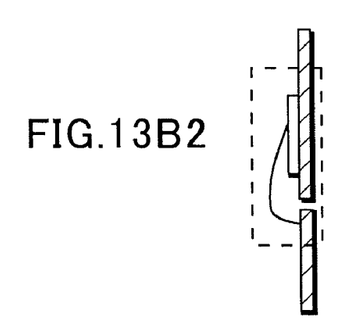
Figure 13C:
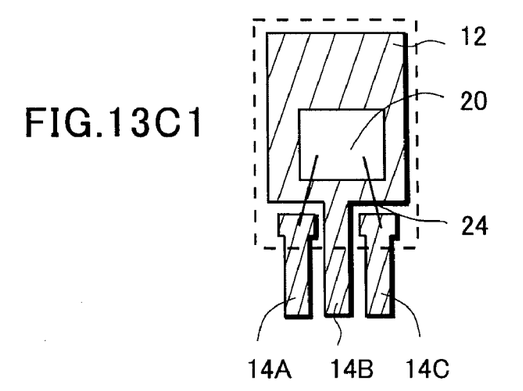
Figure 13C:
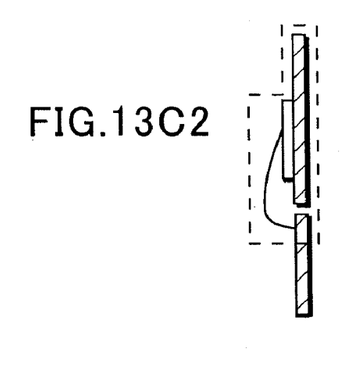

FIG. 13A1 is a top view of the package and FIG. 13A2 is a side view thereof. An external shape of an insulating resin is a hexahedron, and an outer lead portion is exposed from a resin package. Moreover, in FIGS. 13B1 and 13B2, an external shape of an insulating resin is a hexahedron, a head portion of the island 12 is exposed from a resin package, and an outer lead portion is exposed from the resin package. Furthermore, a package shown in FIGS. 13C1 and 13C2 has substantially the same shape as that shown in FIG. 2, in which the island exposed in FIG. 13B1 is thinly covered with an insulating resin. Moreover, screw clamps and the like are also provided as needed.

As an example, in terms of TO220, the island 12 is made of metal consisting mainly of copper having a thickness of about 0.5 mm to 0.6 mm, and is formed by etching or punching. The island 12 has a rectangular shape of about 12.0 mm×14.0 mm, for example, whose upper side on the page space is notched in a semicircular shape. In a portion having such a notched shape, a through-hole 22 is formed, into which a fixing screw is inserted.

From a central portion on the lower side of the island 12, the lead 14B is extended integrally and continuously to the outside. With reference to FIG. 2B, the back surface (lower surface) of the island 12 is covered with the sealing resin 16 to insulate the island 12 from the outside. Moreover, the sealing resin 16 covering the back surface of the island 12 is very thin.

Thus, heat generated by an operation of the semiconductor element 20 is properly discharged to the outside through the island 12 and the thin sealing resin 16.

Figure 13D:
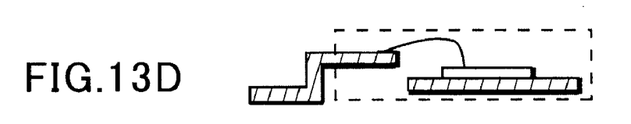

The leads 14 are electrically connected to the mounted semiconductor element 20 in an inner lead portion, and some of the leads are exposed as outer leads and function as the external connection terminals. Moreover, in mounting the semiconductor device 10 on a mounting board or the like, the device is mounted by inserting tip portions of the leads 14 into holes provided in the mounting board. Moreover, for surface mounting, the leads may be bent into a Z shape in an outer lead portion as shown in FIG. 13D.

The semiconductor element 20 is a semiconductor element having a main electrode on its back surface. Specifically, a MOSFET (Metal-Oxide Semiconductor Field Effect Transistor), a bipolar transistor or an IGBT (Insulated Gate Bipolar Transistor) is adopted. As an example, when the MOSFET is adopted as the semiconductor element 20, a drain electrode on a lower surface thereof is connected to the upper surface of the island 12 through a conductive adhesive, a gate electrode on an upper surface thereof is connected to the lead 14A through the thin metal wire 24, and a source electrode on the upper surface is connected to the lead 14C through the thin metal wire 24.

Embodiment 2

With reference to FIGS. 3A to 6C, a method for manufacturing a semiconductor device will be described next.

Figure 3A:
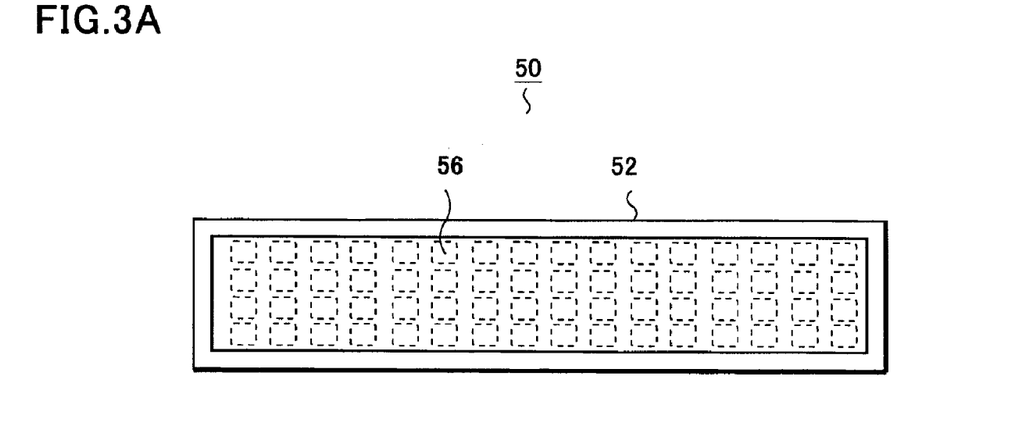
FIG. 3A is a plan view and FIG. 3B is an enlarged plan view showing a method for manufacturing a semiconductor device according to the present invention.

With reference to FIG. 3A, an external shape of a lead frame 50 is a strip shape. Inside a frame-shaped outer frame 52, plural units 56 (mounting part) are formed in a matrix pattern.

Figure 3B:
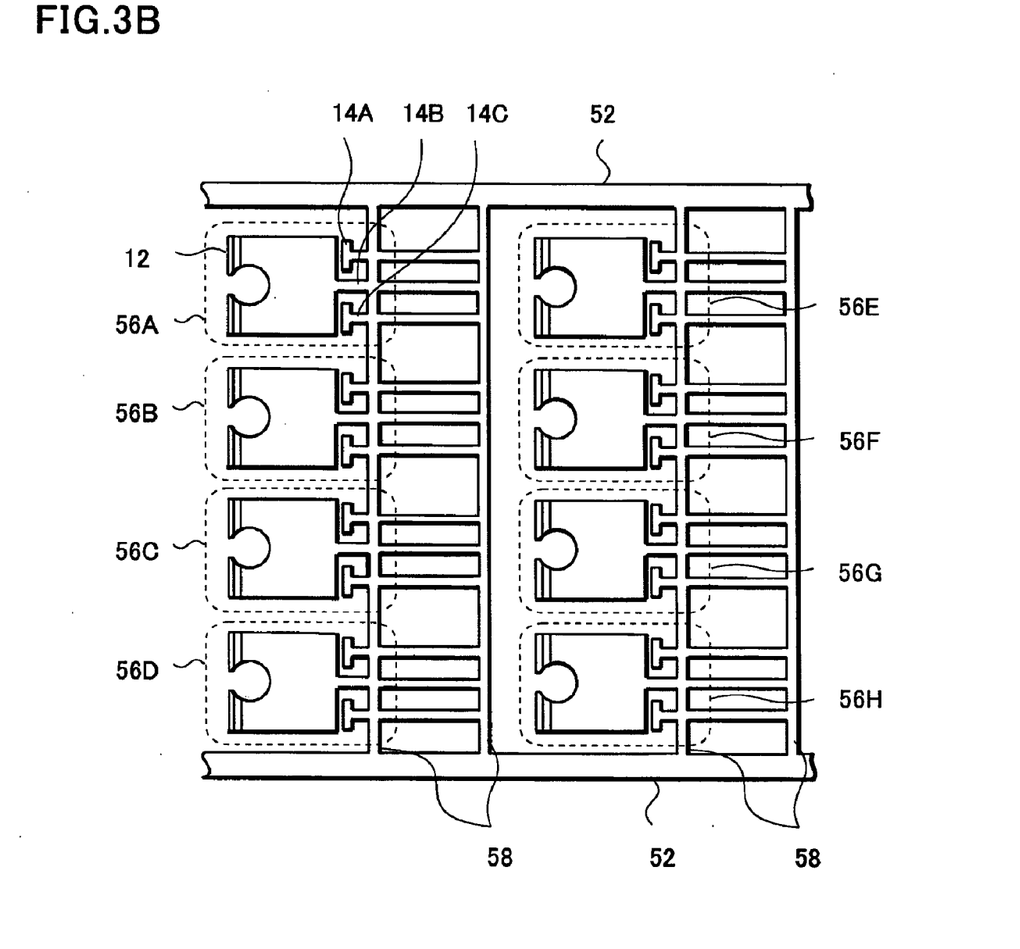

FIG. 3B is a partially enlarged plan view of FIG. 3A. Here, tie bars 58 are extended so as to connect upper and lower outer frames 52. On the page space, the units 56A to 56D are arranged in a line on the left side and connected to each other by the tie bar 58, and the units 56E to 56H are arranged in a line on the right side and connected to each other by the tie bar 58.

Each of the units includes an island 12 and leads 14A to 14C. Moreover, one ends of the leads 14A and 14C are set close to the island 12 and the lead 14B is extended integrally with the island 12. Furthermore, intermediate portions and end portions of the leads 14A to 14C in the unit 56A are connected with the tie bars 58. Similarly, the leads in the other units 56B to 56D are also connected with the tie bars 58. Moreover, the leads in the units 56E to 56H arranged in a line on the right side are also connected by the tie bars 58. Here, the leads in the units horizontally adjacent to each other may be arranged in a zigzag pattern. In this case, for example, the leads 14A to 14C in the unit 56A and the leads 14A to 14C in the unit 56E are arranged in a zigzag pattern so as to face each other.

In either case, the island 12 is supported by the lead 14B that is a thin neck. Thus, deformation will occur when a pressure is applied by resin injection in a subsequent step.

Figure 4:
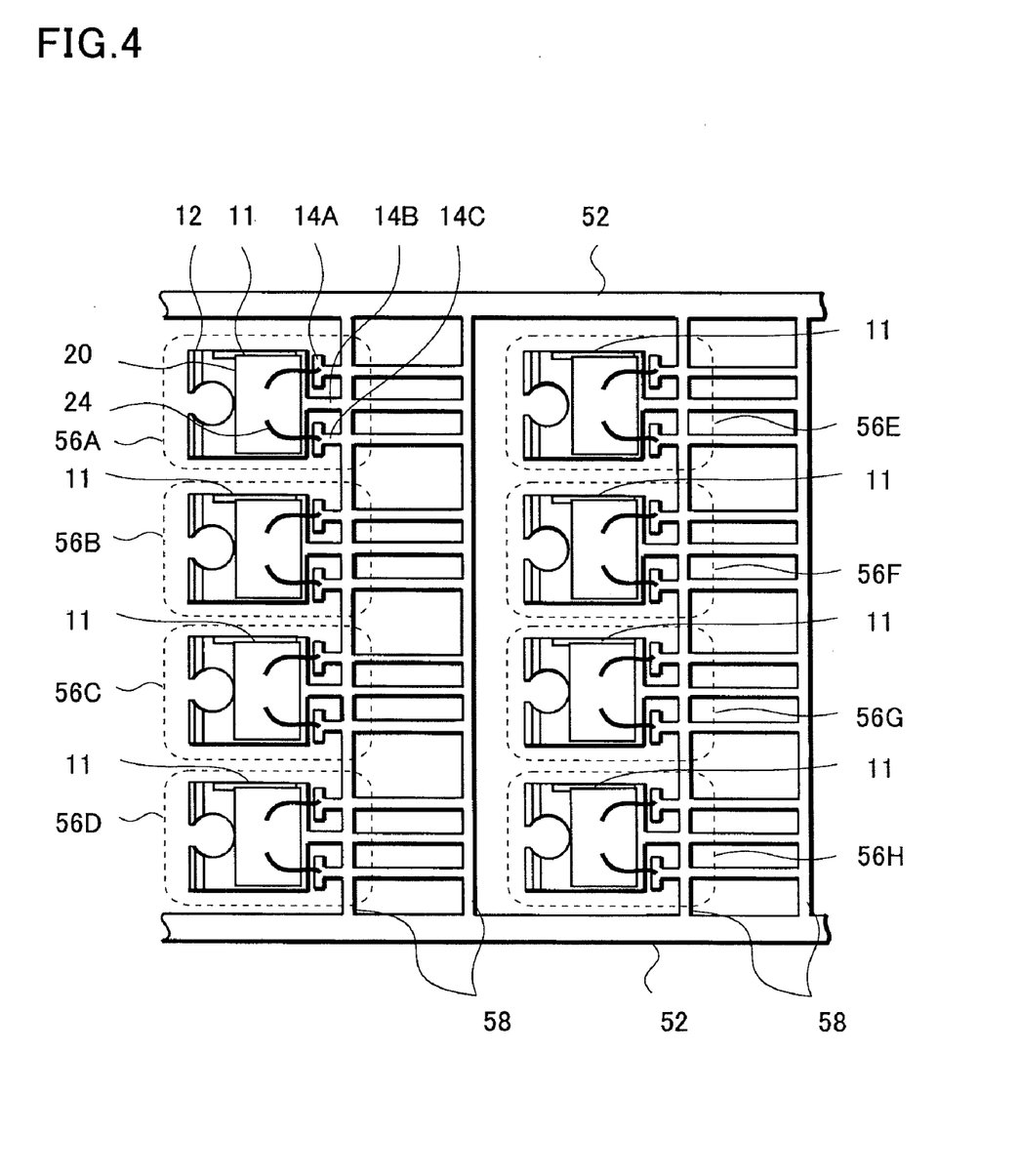
FIG. 4 is a plan view showing the method for manufacturing a semiconductor device according to the present invention.

With reference to FIG. 4, next, a semiconductor element 20 is connected to each of the units. Referring to the unit 56A, the semiconductor element 20 is mounted on an upper surface of the island 12. In the semiconductor element 20, an electrode on a back surface thereof is electrically connected to the upper surface of the island 12 by connection or eutectic bonding using a conductive adhesive such as solder or Ag paste. Moreover, an electrode on an upper surface of the semiconductor element 20 is connected to the leads 14A and 14C through the thin metal wires 24. Here, instead of the thin metal wires 24, a plate-like metal connecting plate made of metal such as copper and Al may be used.

Next, the units are individually sealed with a resin. With reference to FIG. 5A, in this step, injection molding is performed by housing the units individually in cavities 36. In one cavity 36A, the island 12, the semiconductor element 20 and a part of the leads 14A to 14C are housed. Thereafter, a resin sealing step is performed by injecting a liquid sealing resin into the cavity 36 from a gate P2 provided in a side surface of the cavity and then heating and curing the resin. Here, on the page space, the cavities 36A to 36D are arranged in a line on the left side and these cavities communicate with each other through runners 38. Such runners are also called through-gates. Moreover, on the page space, the cavities 36E to 36H are arranged in a line on the right side and these cavities also communicate with each other through the runners 38. Furthermore, a pod 42 is connected to the cavities through runners 44. In the resin sealing, the liquid sealing resin is sequentially supplied to the cavities from the pod 42.

FIG. 5B shows a meandering flow of the injected resin, showing a portion of the cavities 36A and 36B in FIG. 5A. Specifically, if an inlet P2 leading to the cavity 36A from the runner 44 is on a right side (or left side) surface of the cavity, an outlet P1 is provided on a left side surface opposite thereto. Moreover, in the cavity 36B, an inlet P2 is provided on a left side (or right side) surface of the cavity and an outlet P1 is provided on a right side (or left side) surface opposite thereto. Thus, the resin may be allowed to flow in a meandering manner.

The present invention may adopt either FIG. 5A or FIG. 5B.

With reference to FIG. 6A, description will be given of a configuration of a molding die 30 used in this step. The molding die 30 includes an upper die 32 and a lower die 34. The upper and lower dies are fitted together to form the cavities 36A to 36E and the runners 38. In the die 34, the pod 42 is provided. After housing a tablet made of a solid resin in the pod 42 and heating and melting the tablet, the melted sealing resin is pressurized by a plunger 40. Thus, the sealing resin is supplied to each of the cavities. Specifically, a liquid sealing resin is supplied to the cavities from the pod 42 in the order of 36A, 36B, 36C, 36D and 36E from the upstream of the flow of the sealing resin supplied from the pod 42. As described above, the cavities communicate with each other through the runners 38.

With reference to FIG. 6B, the island 12 having the semiconductor element 20 fixed to its upper surface is housed in each of the cavities 36A and 36B. Moreover, a tip of a pressing part 68 (the pin denoted by reference symbol P in FIG. 5A) protruding downward from an inner wall of the upper die comes into contact with the upper surface of the island 12. Even when the melted resin flows into the cavity, upward movement of the island 12 is prevented by the lead 14B formed integrally with two pins in contact with both sides of the tip of the island. The pressing part 68 is a pin movable in a vertical direction. When the sealing resin 16 is injected, a lower end of the pressing part 68 is contact with the upper surface of the island 12. Meanwhile, when the sealing resin 16 is filled and cured, the pressing part 68 is lifted up and separated from the upper surface of the island 12.

The point of the present invention is to provide the runners 38 connecting the cavities 36A and 36B so as to be tilted with respect to a path through which the sealing resin 16 is supplied.

Specifically, a connection portion (outlet) P1 between an air vent of the cavity 36A and the runner 38 is provided around a central portion in a thickness direction of the cavity 36A. Furthermore, the connection portion P1 is provided above the island 12 on which the semiconductor element 20 is mounted. On the other hand, a connection portion (inlet) P2 between the runner 38 and a gate of the cavity 36B is provided below the connection portion P1 and is disposed at the same level in height as the island 12 or below the island 12.

By providing P1 above the island 12, the island 12 is prevented from being moved downward with a pressure of the injected sealing resin 16.

The melted resin entering from P2 is sequentially injected between the lower die and the island 12 and between the island and the upper die. Here, the resin injected between the lower die and the island 12 acts as a force to lift up the island 12. However, the island is held by the two pins and the lead 14B described above. Moreover, the melted resin injected between the island and the upper die comes close to the outlet P1 after covering the back surface of the island. In the conventional case, since P1 and P2 are on the same level in height, a force to lower the island acts near P1 (see FIG. 7B and description thereof).

However, in the present invention, the resin is injected into the next cavity 36B before the melted resin applies a force onto the island 12 by lifting up P1 higher than that in the conventional case. Thus, the pressure applied onto the island 12 by the sealing resin 16 is reduced. As a result, downward movement of the island 12 is prevented.

Furthermore, here, the connection portion P2 between the runner 38 and the cavity 36B is disposed below P1 described above (closer to the end portion in the thickness direction of the cavity 36A). Accordingly, the sealing resin 16 injected into the cavity 36B through the runner 38 can be preferentially supplied to a space below the island 12. As a result, the sealing resin 16 is sufficiently supplied to a region below the island 12. Thus, occurrence of voids in the region is prevented. By preferentially filling the space below the island 12 with the sealing resin 16, a pressure to lift up the island 12 is generated. However, since the upper surface of the island 12 is supported by the pressing part 68, upward movement of the island 12 due to the pressure generated is prevented. Thus, even when a gap between the island 12 and the lower surface of the cavity 36B is set as small as, for example, 40 μm or less, for reduction in thickness, the gap can be filled with the sealing resin 16 without voids.

Furthermore, in this step, the runners 38 are disposed so as to be tilted downward. Therefore, the sealing resin 16 supplied to the cavity 36B from the runner 38 is injected toward a region below the semiconductor element 20, and the region is preferentially filled with the resin. Moreover, by preferentially filling the space below the island 12 with the sealing resin 16 supplied from the runner 38, an amount of the sealing resin 16 filled above the island 12 is suppressed. Accordingly, the pressure of the filled sealing resin 16 pressing the island 12 downward is reduced. Thus, downward movement of the island 12 in the resin sealing step is prevented.

Note that heavy lines in FIGS. 6B and 6C indicate a parting surface between the upper and lower dies.

After the cavities 36A to 36E are filled with the sealing resin 16 by the above step, the filled sealing resin 16 is heated and cured to take out the leads from the die 30.

Furthermore, by cutting the tie bars in the lead frame 50 shown in FIG. 3, the leads 14 in the respective units 56 are separated from the outer frame 52 of the lead frame 50.

FIG. 6C shows the sealing resin 16 taken out of the die. Here, the sealing resins 16 covering the islands 12 are connected by the resin filled in the runner 38. By cutting the sealing resin in the runner 38, the sealing resins 16 of respective circuit devices are separated from each other.

The separation of the sealing resin filled in the runner 38 may be performed by punching with a press or by irradiating a connection portion between the sealing resin 16 and the runner 38 with a laser.

In this step, cutting traces generated by removing the sealing resin in the runner 38 remain on outer surfaces of the sealing resin 16. The cutting traces are at positions asymmetrical to each other. The cutting trace generated on the left-side surface of the sealing resin 16 on the page space is formed at a position higher than the cutting trace formed on the right-side surface by about 1 mm. This is briefly described also in FIG. 1D.

The semiconductor device 10 having the configuration shown in FIG. 2 is manufactured through the above steps.

Embodiment 3

Subsequently, with reference to FIGS. 8 to 12, description will be given of the fact that the present invention can also be applied to an IC. FIG. 8A shows a semiconductor device without an insulating resin. FIG. 8B is a cross-sectional view of the semiconductor device sealed with an insulating resin 106. The semiconductor device shown in FIGS. 8A and 8B includes: a rectangular island 100; lead groups 101 . . . , 101 . . . having one ends adjacent to left and right sides of the island 100; upper and lower suspension leads 102 extended outward from upper and lower sides of the island 100 and integrally holding the island; an IC chip 103 fixed on the island 100; and thin metal wires 105 electrically connecting bonding pads 104 on the chip 103 to the leads 101. The entire device is covered with the insulating resin 106 except for a portion corresponding to outer leads of the leads. Here, although two holding leads 102 are shown in FIG. 8, there may be at least one holding lead. Note that, as the point of the present invention, a back surface of the island 100 is covered with the insulating resin 106.

Figure 9:
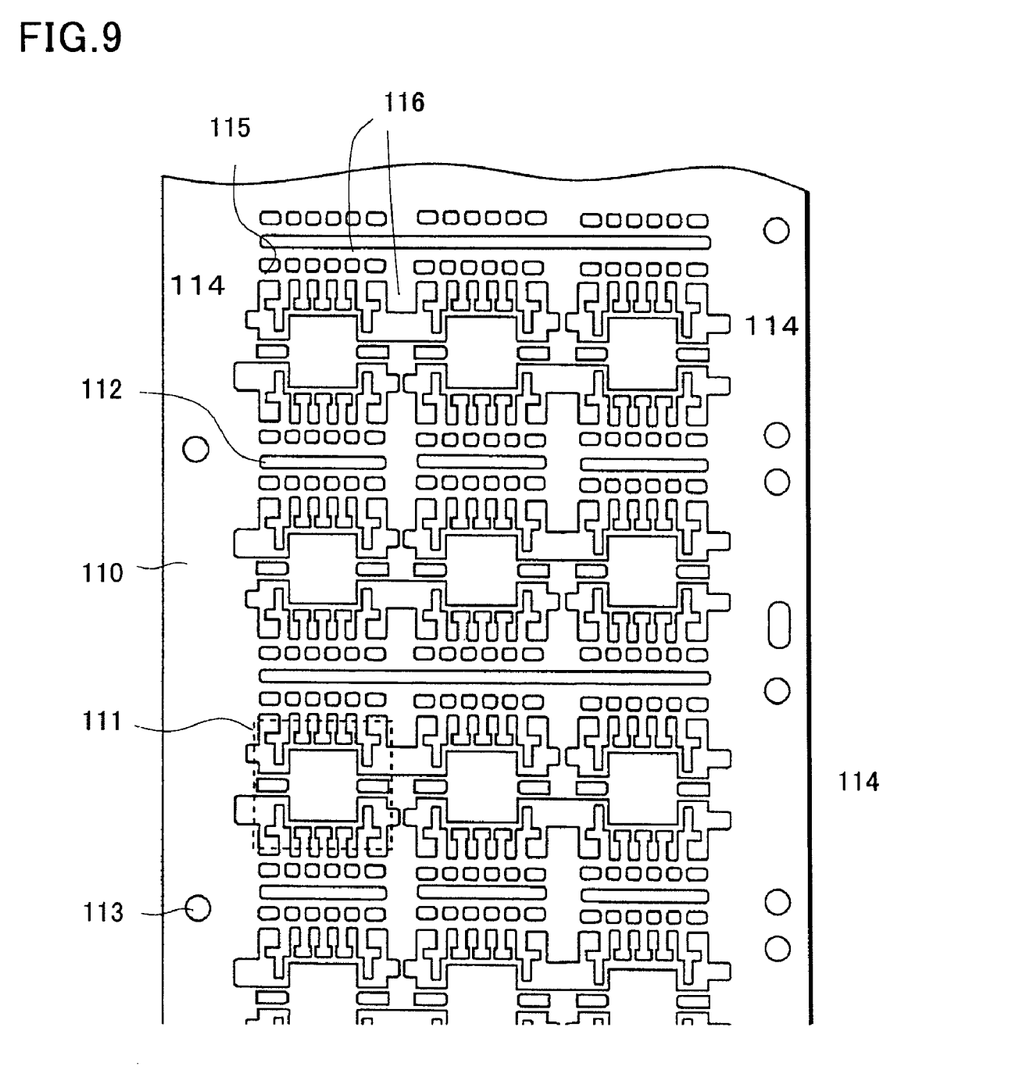
FIG. 9 is a view showing a lead frame used in a method for manufacturing a semiconductor device according to the present invention.

FIG. 9 shows a lead frame 110 in which mounting parts 111 for the elements shown in FIG. 8 are arranged in a matrix pattern. The lead frame has a strip shape as a whole. Moreover, slits 112, index holes 113 and the like are provided. To be more specific, the holding leads 102 shown in FIG. 8 are integrally provided in upper and lower continuous strips 114. Thus, islands in a first upper mounting part and a second lower mounting part are integrated with each other, and at least another island is integrated by the suspension leads between the two islands.

Furthermore, tie bars 115 integrally holding the leads 101 extended on both sides of the island are formed integrally with the upper and lower continuous strips 114. Moreover, between the mounting part and the adjacent mounting parts on both sides thereof as well as between the mounting part and the adjacent mounting parts thereabove and therebelow, second continuous strips 116 are provided. Thus, the lead frames on both sides of the island and the holding leads above and below the island are integrated with the continuous strips.

Figure 10:
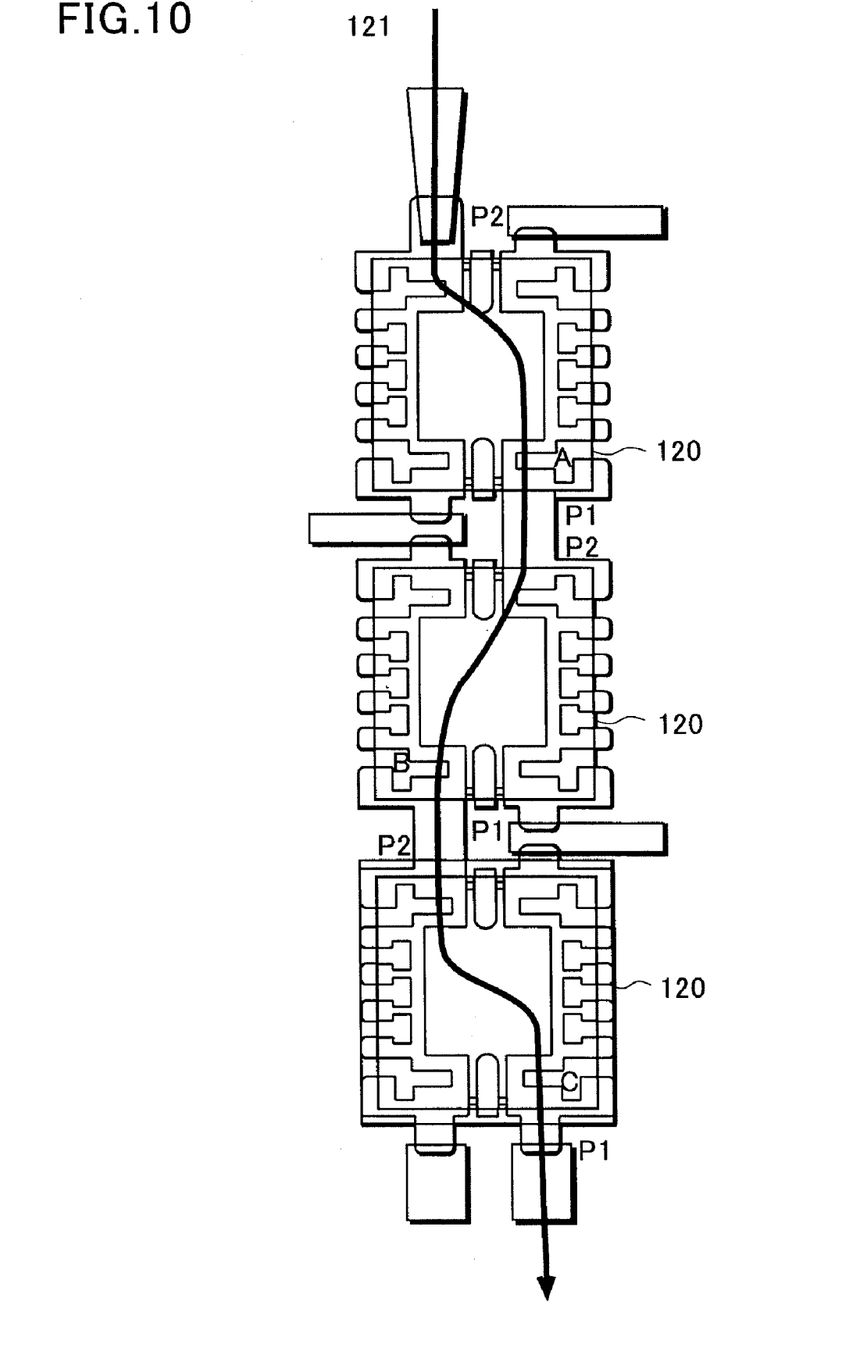
FIG. 10 is a plan view showing the method for manufacturing a semiconductor device according to the present invention.

FIG. 10 shows a planar arrangement when the lead frame 110 is disposed in the die. This is a meandering arrangement described with reference to FIG. 5B. As an example, three cavities 120A to 120C are shown in FIG. 10. The resin enters the cavity 120A from an inlet P2 of a gate part 121 and exits from an outlet P1. Here, attention is focused on leads A to C on left and right sides of the island (or on a lower side of the island) on the outlet side. In the conventional case, the outlet P1 in the vicinity of the leads is on the same level in height as the island as shown in FIG. 7C or on a lower level than the inlet. Thus, a downward pressure is applied to the tip of the inner lead. Moreover, the thin metal wire connected to the portion is deformed or broken. This also prominently emerges from reduction in weight, thickness and length of the semiconductor package, small thicknesses of the lead and island, the thin metal wires and adoption of thin wires made of Al, Cu or the like instead of gold. Thus, the runner configuration as shown in FIG. 6B enables reduction in the resin pressure.

Embodiment 4

Figure 11:
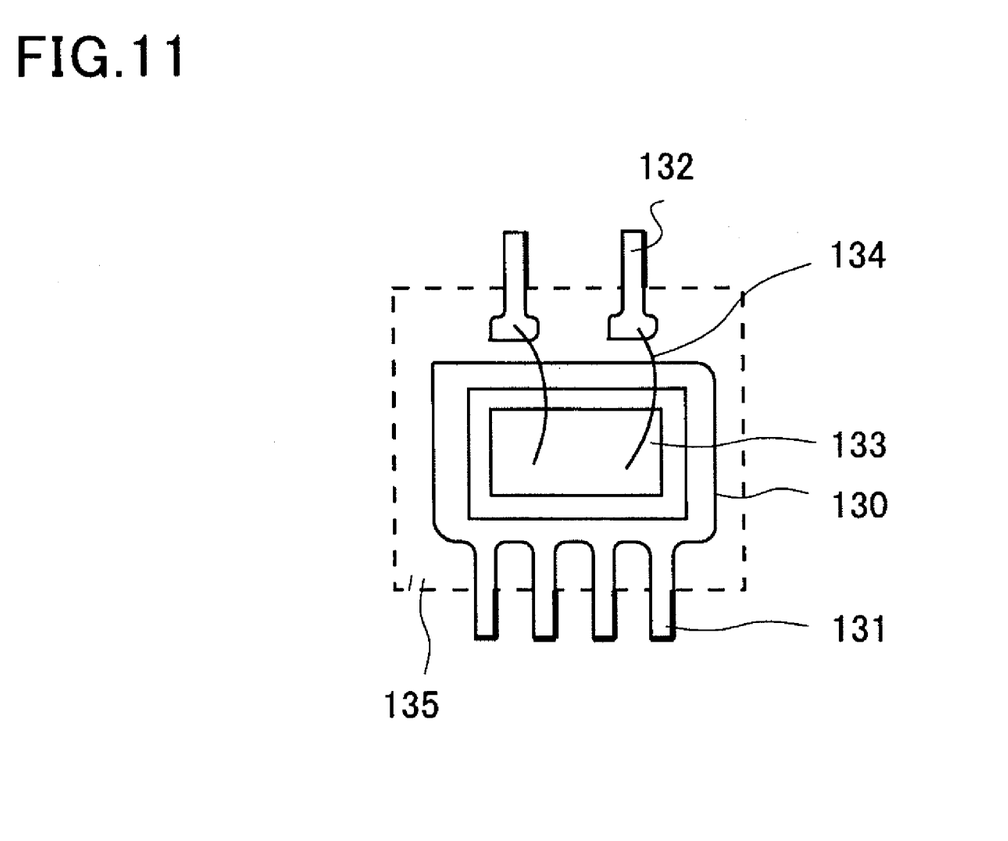
FIG. 11 is a view showing a semiconductor device according to the present invention.

FIG. 11 shows a package called an ECH. On one long side of a rectangular island 130, plural leads 131 integrated with the island are provided. On the other side, plural leads 132 separate from the island 130 are provided. A semiconductor chip 133 is fixed on the island and is connected to the inner leads 132 through thin metal wires 134. Moreover, the package also including a back surface of the island is sealed with an insulating resin 135 indicated by a dotted line.

Figure 12:
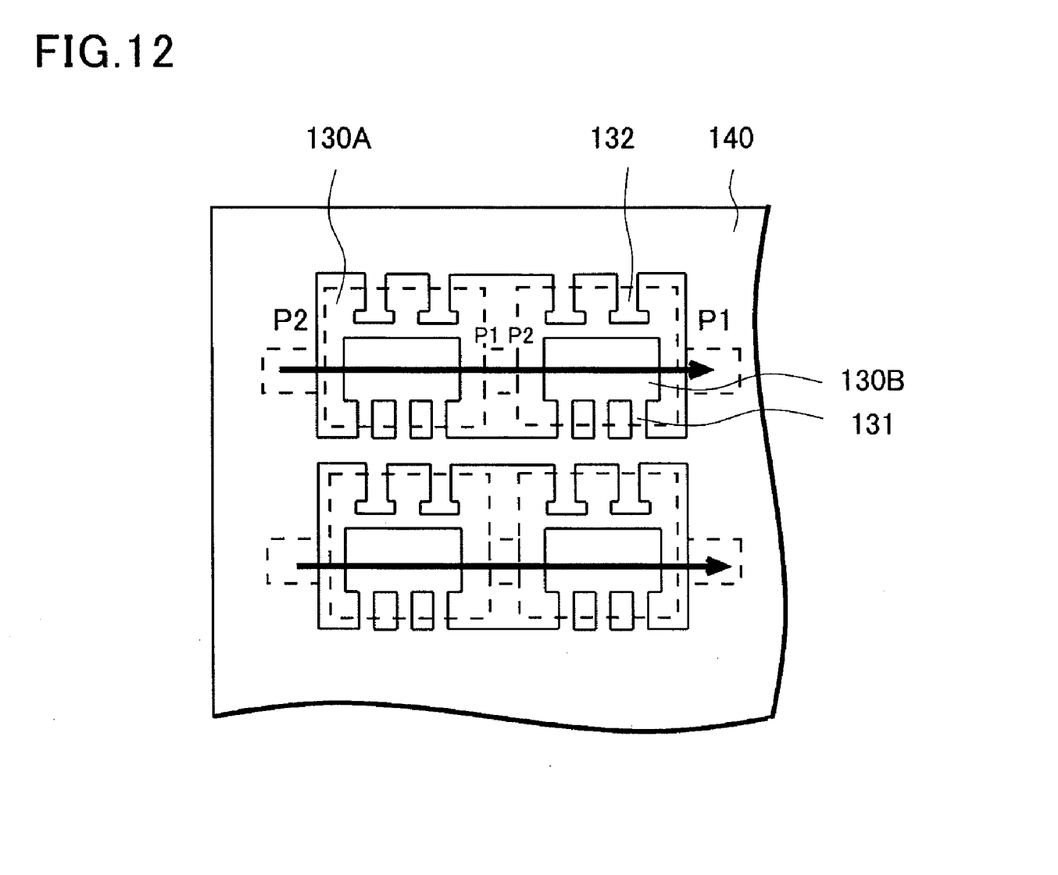
FIG. 12 is a view showing a lead frame used in a method for manufacturing a semiconductor device according to the present invention.

FIG. 12 shows a lead frame 140 adopted for the semiconductor device described above. In FIG. 12, dotted lines indicate cavities, and islands 130 and leads 131, 132 positioned therein are mounting parts. Moreover, arrows indicate flows of the resin. This can also prevents movements of the inner leads 132 and deformation of the thin metal wires as in the case of the above embodiments.

Specifically, the resin enters the cavity through an inlet from a runner on the left side of a first island 130A and then enters the cavity on the right through a through-gate from an outlet.

Here, the inner lead or island near the outlet receives a downward resin pressure and is thus deformed. However, as in the case of FIG. 6, the outlet is on a higher level than the inlet (higher level than the island). Thus, the injection resin pressure can be reduced.

Note that, although the same can be said for all the embodiments, the positional relationship between the upper and lower molding dies may be inverted. Thus, the molding dies are expressed by first and second dies in the claims described below.

The present invention is applicable to a semiconductor package in which a back surface of an island is covered with an insulating resin by use of a through-gate method.

What is claimed is:
1. A method for manufacturing a semiconductor device, comprising:
providing a molding die comprising a first die and a second die, the molding die having a plurality of cavities connected in series through runners from a pod;
placing a lead frame in the molding die so that a mounting part comprising an island and leads having ends connected to the island is disposed in each of the cavities, wherein a semiconductor element is fixed on a top surface of the island, and the leads and the semiconductor element are electrically connected through thin metal wires; and
injecting a molten resin into the cavities through the runners from the pod so that the molten resin fills each of the cavities including a space between a bottom surface of the island and the first die,
wherein an outlet of the molten resin in the cavity is elevated above an inlet of the molten resin in the cavity in a direction perpendicular to the top surface of the island.

2. The method of claim 1, wherein in plan view of the cavity, the cavity has a rectangular shape having four sides, and the outlet and the inlet are provided in side surfaces of the sides facing each other.

3. The method of claim 1, further comprising:
curing the molten resin;
taking the resin-sealed semiconductor device out of the molding die;
removing the resin filling the runners; and
providing cutting traces on side surfaces of the semiconductor device.

4. The method of claim 1, wherein the inlet is below the island in the perpendicular direction.

5. The method of claim 1, wherein during the injection, pressing part provided in the molding die is brought into contact with the top surface of the island.

6. A semiconductor device manufactured by use of the manufacturing method according to claim 1, 2, 4, or 5, wherein cutting traces are formed on side surfaces of the semiconductor device by removing the resin filling the runners, and the cutting trace formed on one side surface and the cutting trace formed on the other side surface facing the one side surface are arranged asymmetrical to each other.

7. A molding die having a plurality of cavities provided therein, each cavity being configured to house an island having a semiconductor element mounted thereon and to seal the island with a resin, comprising:
a first cavity;
a second cavity disposed downstream of the first cavity in a path through which a liquid sealing resin is supplied; and
a runner having one end connected to the first cavity and another end connected to the second cavity,
wherein a connection portion between the runner and the second cavity is lower than a connection portion between the runner and the first cavity in a vertical direction of the first and second cavities.

8. The molding die according to claim 7, wherein the runner is disposed so as to be tilted with respect to a movement direction of an injected sealing resin.

9. The molding die according to claim 7, further comprising a pressing part configured to come into contact with an upper surface of the island.

10. The method of claim 1, wherein the first die and the second die are stacked vertically.

11. A method for manufacturing a semiconductor device, comprising:
providing a molding die comprising a first die and a second die, the molding die having a plurality of cavities connected in series through runners from a pod;
placing a lead frame in the molding die so that a mounting part is disposed in each of the cavities, the mounting part comprising a rectangular island with first and second sides facing each other and third and fourth sides facing each other, holding leads being connected to the first and second sides adjacent inlet and an outlet of the cavity, and a plurality of leads extending toward the third and fourth sides, wherein a semiconductor element is fixed on a top surface of the island, and where the leads and the semiconductor element are electrically connected through thin metal wires; and
injecting a molten resin into the cavities through the runners from the pod so that the molten resin fills each of the cavities including a space between a bottom surface of the island and the first die,
wherein an outlet of the molten resin in the cavity is elevated above an inlet of the molten resin in the cavity in a direction perpendicular to the top surface of the island.

12. The method of claim 11, wherein in a plan view of the molding die the inlets do not align in a straight line and the outlets do not align in a straight line.

13. The method of claim 11, further comprising curing the molten resin, taking the semiconductor device out of the molding die, removing the resin filled in the runners, and providing cutting traces on side surfaces of the semiconductor device.

14. The method of claim 11, wherein the outlet is provided above the island housed in the cavity.

15. The method of claim 11, wherein the first die and the second die are stacked vertically.

16. A method for manufacturing a semiconductor device, comprising:
providing a molding die comprising a first die and a second die, the molding die having a plurality if cavities connected in a series through runners from a pod;
placing a lead frame in the molding die so that a mounting part comprising an island and leads having one ends connected to the island is disposed in each of the cavities, wherein a semiconductor element is fixed on a top surface of the island, and the leads and the semiconductor element are electrically connected through thin metal wires; and
injecting a molten resin into the cavities through the runners from the pod so that the molten resin fills each of the cavities including a space between a bottom surface of the island and the first die,
wherein each of the cavity has an inlet and an outlet of the molten resin,
in plan view of the molding die the inlets do not align in a straight line and the outlets do not align in a straight line, and
in sectional view of the molding die the inlets and the outlets do not align in a straight line.

* * * * *